US012706583B2

(12) United States Patent
Williams

(10) Patent No.: US 12,706,583 B2

(45) Date of Patent: Aug. 11, 2026

(54) SYSTEMS AND METHODS FOR IMPEDANCE MATCHING IN PLASMA CREATION AT ATMOSPHERIC PRESSURE

(71) Applicant: Surfx Technologies LLC, Redondo Beach, CA (US)

(72) Inventor: Thomas Scott Williams, Long Beach, CA (US)

(73) Assignee: Surfx Technologies LLC, Redondo Beach, CA (US)

( * ) Notice: Subject to any disclaimer, the term of this patent is extended or adjusted under 35 U.S.C. 154(b) by 145 days.

(21) Appl. No.: 18/615,375

(22) Filed: Mar. 25, 2024

(65) Prior Publication Data

US 2025/0300620 A1 Sep. 25, 2025

(51) Int. Cl.

*H03H 7/38* (2006.01)
*H05H 1/46* (2006.01)

(52) U.S. Cl.

CPC ............ *H03H 7/38* (2013.01); *H05H 1/4645* (2021.05); *H05H 2242/24* (2021.05); *H05H 2242/26* (2021.05)

(58) Field of Classification Search

CPC . H03H 7/40; H03H 7/38; H03H 11/04; H03H 11/30; H03H 7/0115; H03H 2007/386; H03H 7/383; H03H 11/28

See application file for complete search history.

(56) References Cited

U.S. PATENT DOCUMENTS

| | | | |
|---|---|---|---|
| 3,437,864 | A | 4/1969 | Kofoid et al. |
| 4,088,926 | A | 5/1978 | Fletcher et al. |
| 4,434,742 | A | 3/1984 | Henaff et al. |
| 5,147,493 | A | 9/1992 | Nishimura et al. |
| 5,198,724 | A | 3/1993 | Koinuma et al. |
| 5,285,046 | A | 2/1994 | Hansz |
| 5,309,063 | A | 5/1994 | Singh |
| 5,414,324 | A | 5/1995 | Roth et al. |
| 5,689,215 | A | 11/1997 | Richardson et al. |
| 5,789,867 | A | 8/1998 | Westendorp et al. |
| 5,961,772 | A | 10/1999 | Selwyn |
| 5,977,715 | A | 11/1999 | Li et al. |
| 5,997,956 | A | 12/1999 | Hunt et al. |
| 6,204,605 | B1 | 3/2001 | Laroussi et al. |
| 6,262,523 | B1 | 7/2001 | Selwyn et al. |
| 6,465,964 | B1 | 10/2002 | Taguchi et al. |

(Continued)

OTHER PUBLICATIONS

Inomata et al., Open air deposition of SiO2 film from a cold plasma torch of tetramethoxysilane-H2-Ar system, Appl. Phys. Lett., Jan. 3, 1994, pp. 46-47, 64(1).

(Continued)

*Primary Examiner* — John W Poos

(74) *Attorney, Agent, or Firm* — Canady & Lortz LLP; Bradley K. Lortz

(57) ABSTRACT

A system comprises a standalone matching network configured to be coupled to a power controller and an atmospheric pressure plasma creation device by way of coaxial cables of arbitrary length. The matching network comprises circuitry to receive electrical power by way of the first coaxial cable, receive a control signal including instructions to tune the impedance by adjusting a magnitude and phase of the electrical power in a way that minimizes impedance in the system; and output the electrical power by way of the second coaxial cable.

20 Claims, 10 Drawing Sheets

(56) References Cited

U.S. PATENT DOCUMENTS

| | | | |
|---|---|---|---|
| 6,659,110 B2 | 12/2003 | Forsnel et al. | |
| 6,730,238 B2 | 5/2004 | Li et al. | |
| 7,329,608 B2 | 2/2008 | Babayan et al. | |
| 8,328,982 B1 | 12/2012 | Babayan et al. | |
| 8,567,658 B2 | 10/2013 | Schulte | |
| 9,406,485 B1 | 8/2016 | Cheng et al. | |
| 10,032,609 B1 | 7/2018 | Cheng et al. | |
| 2001/0006093 A1 | 7/2001 | Tabuchi et al. | |
| 2002/0008480 A1 | 1/2002 | Yamazaki et al. | |
| 2002/0129902 A1 | 9/2002 | Babayan et al. | |
| 2006/0156983 A1 | 7/2006 | Penelon et al. | |
| 2007/0229181 A1* | 10/2007 | Omae | H03F 1/565 333/17.2 |
| 2010/0190098 A1 | 7/2010 | Walker et al. | |
| 2010/0261302 A1 | 10/2010 | Rana et al. | |
| 2010/0304146 A1 | 12/2010 | Krebs et al. | |
| 2012/0000888 A1* | 1/2012 | Kawasaki | H03H 7/38 333/17.3 |
| 2014/0054269 A1 | 2/2014 | Hudson et al. | |
| 2014/0152189 A1 | 6/2014 | Gilmore | |
| 2017/0310008 A1* | 10/2017 | White | H03H 7/40 |
| 2017/0345620 A1* | 11/2017 | Coumou | H03F 1/3223 |
| 2020/0412322 A1 | 12/2020 | Ouyang et al. | |
| 2021/0384010 A1 | 12/2021 | Almgren et al. | |
| 2023/0378123 A1 | 11/2023 | Huang et al. | |

OTHER PUBLICATIONS

Koinuma et al., Development and application of a microbeam plasma. generator, Appl. Phys. Lett., Feb. 17, 1992, pp. 816-817, 60(7).

Surfx Technologies LLC, “Atomflo,” 2003.

Surfx Technologies LLC, “Atomflo Model 400 (V2.0HE), Installation and Operations Manual,” Rev. F, May 2016.

Surfx Technologies LLC, “Atomflo-500,” 2004.

Surfx Technologies LLC, “Atomflo-R,” 2003.

Surfx Technologies LLC, “Atomflo Portable Plasma System Model 400 (V2.0HE), Installation and Operations Manual,” Rev. D, Sep. 2010.

Surfx Technologies LLC, “Atomflo Model 400 (V2.0HE), Installation and Operations Manual,” Rev. B, Oct. 2009.

Surfx Technologies LLC, “Technical Datasheet, Plasma Treatment of Polypropylene Using the Atomflo Atmospheric Plasma System,” Jul. 27, 2009.

Shulte et al., “Characterization of a Novel Fluxless Surface Preparation Process for Die Interconnect Bonding,” 2012 IEEE 62nd Electronic Components and Technology Conference (ECTC), 2012.

Barankin et al., “Properties of fluorinated silica glass deposited at low temperature by atmospheric plasma-enhanced chemical vapor deposition,” Thin Solid Films 519, pp. 1307-1313, 2010.

Williams et al., “Atmospheric Pressure Plasma Effects on the Adhesive Bonding Properties of Stainless Steel and Epoxy Composites,” SAMPE 2012—Baltimore MD—May 21-24, 2012.

Williams et al., “Atmospheric Pressure Plasma Activation of Polymers and Composites for Adhesive Bonding: A Critical Review,” Rev. Adhesion Adhesives, vol. 1, No. 1, Feb. 2013.

Yu et al., “Rapid oxidative activation of the carbon nanotube yarn and sheet by radio frequency, atmospheric pressure plasma,” Carbon, vol. 57, pp. 11-21, Jun. 2013.

International Search Report and Written Opinion International Application No. PCT/US2025/021382.

* cited by examiner

SYSTEMS AND METHODS FOR IMPEDANCE MATCHING IN PLASMA CREATION AT ATMOSPHERIC PRESSURE

BACKGROUND OF THE INVENTION

1. Field of the Invention

The present disclosure is related to systems and methods for reliable and predictable plasma creation. In particular, the present disclosure is related to a new system and method of impedance matching in atmospheric pressure plasma creation.

2. Description of Related Art

Atmospheric pressure plasmas have been developed to treat an object of any size and shape because such objects do not need to be loaded into a vacuum chamber. This can significantly reduce the cost of the process. A number of different atmospheric pressure plasma devices have been developed (Schutze, et. al., "The atmospheric-pressure plasma jet: A review and comparison to other plasma sources", IEEE Trans. Plasma Sci. 26, 1685-1694 (1998)). These plasmas are governed by how the ionization process is controlled. At atmospheric pressure, the gas density is so high that the ionization reaction can easily run away and generate a high temperature arc, which is not useful for materials processing.

For the production of any given plasma species, the specific plasma species produced must be monitored to guarantee that active species are being produced during the treatment, and that such production is stable. This is especially important as different plasma species may be produced at non-ideal electrical match points (i.e., higher reflected power, lower forward power, or both). One way to improve production of a stable uniform species of plasma is to match the impedance in the circuit between the RF source (i.e. the power controller), and the load (i.e., the plasma source). This thereby maximizes the amount of forward power delivered to the atmospheric plasma creation device and minimizes the power reflected back to the RF power amplifier.

In U.S. Pat. No. 10,032,609 (the "609 patent"), a method is disclosed for impedance matching that includes tuning a set of adjustable capacitors to maintain impedance matching in spite of large differences in impedance between striking the discharge and operating it at steady state conditions. As disclosed in the '609 patent, the method uses impedance-matching circuitry that includes two variable capacitors and an automatic tuning algorithm that relies directly on the differences between the forward and reflected RF power, yielding the proper impedance match without having the plasma extinguish during strike and operation. Such circuitry allows for adjusting the complex impedance of the load in the RF system such that it always appears as 50 ohms when different plasma sources and/or recipe settings are used. In addition, the adjustable capacitors are adjusted to positions to yield a high voltage potential within the plasma source when first initiating (i.e., striking) plasma. In this system, tuning coefficients are employed in the operation of the tuning algorithm. Adjusting the phase capacitor in this system changes the forward power and the reflected power, while adjusting the load capacitor also changes (by a different amount) the forward power and reflected power. The amount that the forward and reflected power changes (i.e., the tuning responses) with adjustments to the load and phase capacitor is stored as tuning coefficients in the controller configuration file.

To provide such a system for practical, commercial use, an average set of tuning coefficients has been determined that are suitable for linear heads using helium or argon with oxygen, hydrogen or nitrogen over a range of power settings. To improve tuning capability for a given head, new coefficients would have to be determined. Because tuning coefficients are stored in the controller configuration file, however, they apply to all heads and all recipes on a given power controller. Thus, if two types of plasma sources are used, each would require separate specific tuning coefficients for optimal tuning, and so a compromise of tuning coefficients may need to be determined as only one set of coefficients is stored. In other words, because tuning coefficients have to be precalculated for each commercial device, the impedance-matching circuitry must be placed in a fixed position inside the power controller in a way that does not account for the layout or configuration of the building where the plasma-creation system will be placed. This method of tuning thus requires cables of predetermined length and a limited geometry for how a commercial product is laid out within a facility, which means placement of the power controller is limited.

In view of the foregoing, there is a need for a plasma device and method that is suitable for electronic materials processing, and that does not generate particles which can be harmful to manufacturing operations. These and other needs are met by embodiments of the present invention as described hereafter.

SUMMARY OF THE INVENTION

Generating an atmospheric plasma (i.e., plasma creation at atmospheric pressure) exhibits new challenges related to the difficulty of igniting, stabilizing, and maintaining the discharge in the presence of the high collisional frequency and short mean-free path present at ambient pressures. The impedance of the atmospheric pressure plasma creation device can change significantly due to factors such as temperature, pressure, and gas composition. In addition, it may not be practical to place the matching network in close proximity to the atmospheric pressure plasma creation device which then requires a predetermined distance between the matching network and plasma.

Disclosed herein are systems and methods for impedance matching within an atmospheric plasma-creation system. Various embodiments include a standalone matching network that can adjust in real time the magnitude and phase of the RF power, and can be located an arbitrarily selected distance from a power source, to minimize those differences independently of each other.

One embodiment comprises a detector that includes circuitry to make real time measurements of the magnitude and phase of the current and voltage waves moving through the RF circuit within an atmospheric pressure plasma production network. These combined current and voltage waves will be referred to as the RF power. Forward power is provided by a power controller via an electrical conduit and is reflected by an atmospheric pressure plasma creation device along the same conduit if there is an impedance mismatch within the circuit. In an embodiment, the detector reads the magnitude of the RF power in the line and translates that into a magnitude DC voltage in a magnitude DC voltage indicator. Independently of this operation, the detector reads the phase angle of the RF power in the line and translates that into a phase DC voltage in a phase DC voltage indicator.

In an embodiment, the outputs from the magnitude DC voltage indicator and the phase DC voltage indicator are then digitized and fed into a phase and magnitude tuning control algorithm, respectively, to generate inputs to be provided to a matching network. In an embodiment, the algorithm performs a single tuning iteration, generating a signal from the magnitude DC voltage indicator into the matching network to tune a variable load capacitor, while independently outputting a signal from the phase DC voltage indicator into a variable phase capacitor, allowing for real time tuning of the network to create a single impedance throughout the network. In an embodiment, the desired outcome of the tuning algorithm is to produce a 50 ohm impedance from the matching network. This means that the impedance in the circuit is purely resistive without any reactance and the current and voltage waves will have a phase angle of 0 and a voltage with an amplitude 50 times larger than the current. Monitoring the phase and magnitude in real time allows for repeating the algorithm multiple times as conditions require.

Embodiments can further include the detector being optimally placed proximate to the power source. Additionally, embodiments can include the matching network being optimally placed proximate to the atmospheric pressure plasma source at a distance from the power source and the detector that can be chosen based on the geometry of a facility where the system is installed, rather than at a predetermined distance required for statically tuning the impedance, as discussed above.

In an embodiment, the matching network can be placed at a distance from the power controller, and near enough to the system's plasma creation device (i.e., the plasma source) to allow for (i) the efficient dynamic minimization of the system's impedance, and (ii) a flexible configuration of the plasma systems components (i.e., relatively arbitrary placement of the power source and plasma source).

Thus, embodiments of the present disclosure allow for monitoring and tuning the system by matching both the magnitude and phase of the RF power in real time, giving the user a reliable method of ensuring the desired plasma species are being created and emitted from the atmospheric pressure plasma creation device.

In one exemplary embodiment, a system includes a matching network, where the matching network comprises receiving circuitry to receive magnitude and phase control signals from an RF power source for combined electrical power, a variable load capacitor, a variable phase capacitor, and tuning circuitry coupled to the receiving circuitry, the tuning circuitry responsive to the magnitude and the phase control signals to tune an impedance presented to the RF power source, the impedance tuned by independently adjusting each of the variable load capacitor and the variable phase capacitor of the matching network. The system can include a detector receiving combined electrical power comprising both forward power and reflected power and electrically coupled to the receiving circuitry to receive the magnitude and phase control signals, the detector including calculating circuitry to calculate a magnitude DC voltage indicator signal and a phase DC voltage indicator signal in real time. The calculating circuitry can calculate the magnitude and phase control signals in real time performing the operations of converting at least a first portion of the combined electrical power into a first current signal, converting at least a second portion of the combined electrical power into a first voltage signal, creating the magnitude DC voltage indicator signal using the first current signal and the first voltage signal, converting at least a third portion of the combined electrical power into a second current signal, converting at least a fourth portion of the combined electrical power into a second voltage signal, and creating the phase DC voltage indicator signal using the second current signal and the second voltage signal. The system can further include a first cable connector for receiving RF electrical power from the RF power source and a second cable connector to output the RF electrical power. These and other system embodiments can be further modified by any of the described system, device or method embodiments described herein.

In some embodiments, the system can further comprise a power controller located within a power controller housing different from a matching network housing that includes the matching network and an atmospheric pressure plasma creation device located within a plasma creation device housing different from the matching network housing. The power controller is electrically coupled to the matching network via a first RF cable, and where the atmospheric pressure plasma creation device is electrically coupled to the matching network via a second RF cable. The detector can be contained within the power controller housing or the detector can be a standalone device.

In further embodiments, the tuning circuitry to adjust the variable phase capacitor is capable of moving the variable phase capacitor to a new phase position, where the new phase position of the variable phase capacitor is calculated by the following equation: [the new phase position]=[a current phase capacitor position]+[the phase DC voltage indicator signal]×[a phase gain]; and the tuning circuitry to adjust the variable load capacitor is capable of moving the variable load capacitor to a new load position, where the new load position of the variable load capacitor is calculated by the following equation: [the new load position]=[a current load capacitor position]+[the magnitude DC voltage indicator signal]×[a magnitude gain].

In another exemplary embodiment a method comprises receiving, at a matching network, electrical power by way of a first RF cable, receiving a magnitude control signal, and a phase control signal, tuning, based on the received magnitude control signal and the received phase control signal, an impedance of the electrical power by independently adjusting a variable load capacitor and a variable phase capacitor, and outputting the electrical power comprising the tuned impedance by way of a second coaxial cable. Tuning the impedance can include tuning instructions for adjusting based on a magnitude DC voltage indicator signal, a variable load capacitor until the magnitude DC voltage indicator signal is substantially zero and adjusting, based on a phase DC voltage indicator signal, a variable phase capacitor until the phase DC voltage indicator signal is substantially zero. The adjusting of the variable phase capacitor is performed independently of the adjusting the variable load capacitor. The method can further comprise calculating the magnitude DC voltage indicator signal and the phase DC voltage indicator signal in real time. These and other method embodiments can be further modified by any of the described system, device or method embodiments described herein.

In yet another exemplary embodiment a method comprises receiving, at a detector, combined electrical power comprising both forward power and reflected power in a system that includes an atmospheric pressure plasma creation device configured to operate at atmospheric pressure, the combined electrical power having an impedance, converting the combined electrical power into a magnitude DC voltage indicator signal and a phase DC voltage indicator signal, calculating, at a processor, instructions to tune the impedance to independently adjust a magnitude and a phase of the combined power, sending the instructions via a signaling cable to a matching network, and tuning the impedance according to the instructions. The matching network can comprise a standalone matching network. Converting the combined electrical power can include converting at least a first portion of the combined electrical power into a first current signal, converting at least a second portion of the combined electrical power into a first voltage signal, creating, using the first current signal and the first voltage signal, a magnitude DC voltage indicator signal, converting at least a third portion of the combined electrical power into a second current signal, and converting at least a fourth portion of the combined electrical power into a second voltage signal, creating, using the second current signal and the second voltage signal, a phase DC voltage indicator signal, where said tuning the impedance includes adjusting, based on the magnitude DC voltage indicator signal, a load capacitor until the magnitude DC voltage indicator signal is substantially zero and adjusting, based on the phase DC voltage indicator signal, a phase capacitor until the phase DC voltage indicator signal is substantially zero, where the adjusting of the phase capacitor being performed independently of the adjusting of the load capacitor. Creating the magnitude DC voltage indicator signal can comprise scaling at least one of the first voltage signal and the first current signal to make the first voltage signal similar to the first current signal, rectifying the first voltage signal to produce a first positive DC signal, rectifying the first current signal to produce a first negative DC signal, and summing the first positive DC signal and the first negative DC signal to produce the magnitude DC voltage indicator signal. Creating the phase DC voltage indicator signal can comprise shifting the second voltage signal relative to the second current signal to create a shifted voltage signal, decomposing the second current signal into a shifted current signal and an unshifted current signal, where the shifted current signal is shifted by 90 degrees, adding the unshifted current signal to the shifted voltage signal to produce a first phase signal, adding the shifted current signal to the shifted voltage signal to produce a second phase signal, rectifying the first and second phase signal, and summing the first and second phase signal to produce the phase DC Voltage indicator signal. The method can further include digitizing both the magnitude DC voltage indicator signal and the phase DC voltage indicator signal; and applying a phase algorithm to the phase DC voltage indicator signal, and a magnitude algorithm to the magnitude DC voltage indicator signal, where the phase algorithm and magnitude algorithm are linearly independent of each other. Adjusting the phase capacitor can comprise changing a phase position of the phase capacitor to a new phase position, thereby changing phase capacitance of the phase capacitor, and adjusting the load capacitor can comprise changing a load position of the load capacitor to a new load position, thereby changing load capacitance of the load capacitor. The new phase position can be calculated by the following equation: [the new phase position]=[a previous phase capacitor position]+[the phase DC voltage indicator signal]×[a phase gain]; and the new load position can be calculated by the following equation: [the new load position]=[a previous load capacitor position]+[the magnitude DC voltage indicator signal]×[a magnitude gain]. These and other method embodiments can be further modified by any of the described system, device or method embodiments described herein.

BRIEF DESCRIPTION OF THE DRAWINGS

Referring now to the drawings in which like reference numbers represent corresponding parts throughout.

DETAILED DESCRIPTION INCLUDING THE PREFERRED EMBODIMENTS

As described above, systems and methods for impedance matching are disclosed for use in plasma creation at atmospheric pressure. In an exemplary embodiment, plasma creation occurs at atmospheric pressure and at low temperatures, with high concentrations of reactive species in the effluent stream. The systems and methods can be used to optimize production of preferred plasma species in a given system. As used in this specification, the singular forms "a" "an" and "the" include plural referents unless the context clearly dictates otherwise. Thus, for example, the term "a processor," or any other network-related component recited, is intended to mean one or more of that component, or a combination thereof.

Figure 1:
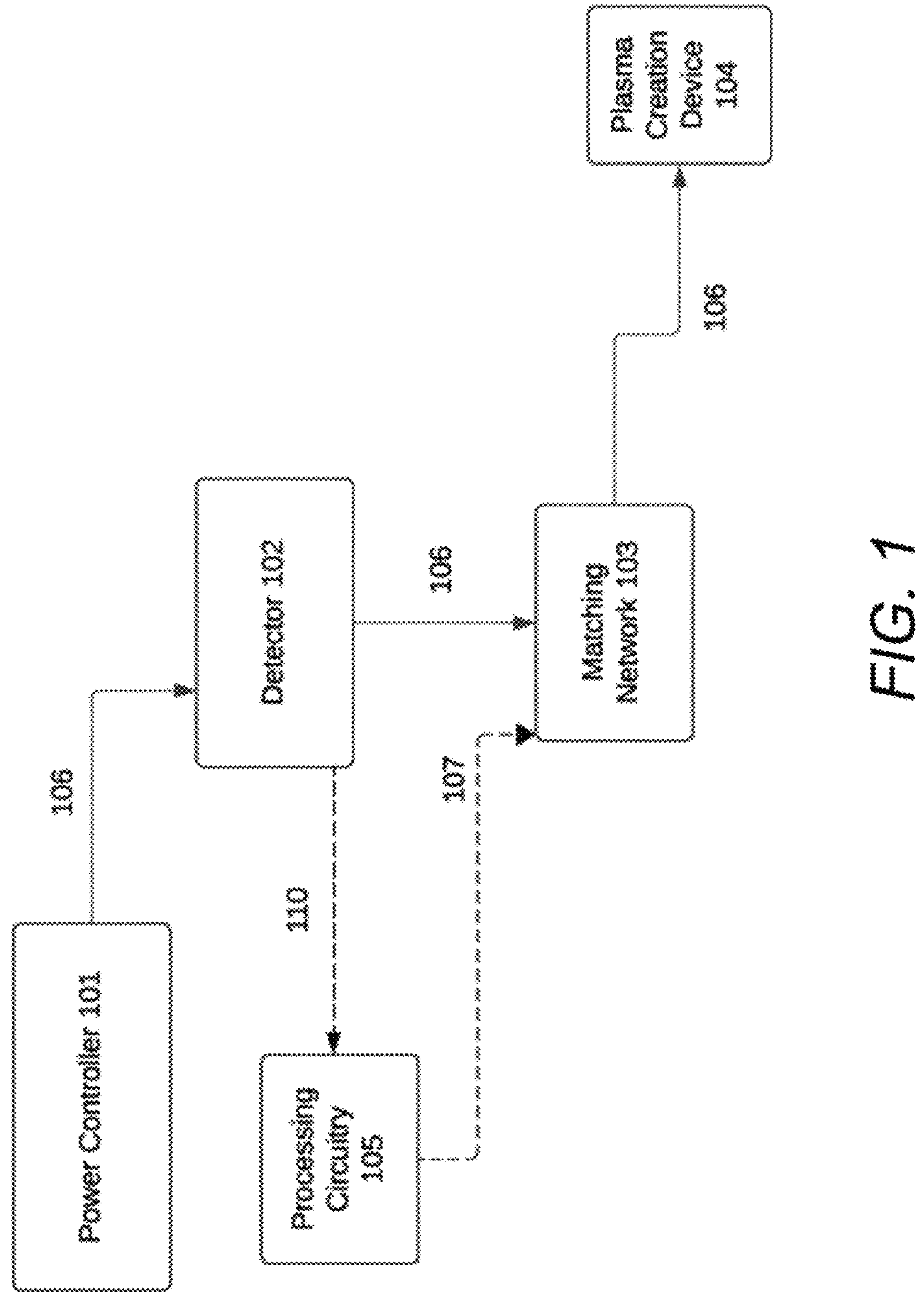
FIG. 1 is a block diagram of a system including components for phase and magnitude impedance matching of RF power in the context of an atmospheric pressure plasma-creation system, according to an embodiment.

FIG. 1 is a block diagram of a system for providing phase and magnitude impedance matching in a plasma-creation system. In an embodiment, the system comprises a power controller 101 electrically coupled to plasma creation device 104 by way of a standalone phase and magnitude detector 102 (the "detector") and a standalone impedance matching network 103 (the "matching network"), via electrical pathway 106. In an embodiment, electrical pathway 106 can be a coaxial cable. For the purposes of the present invention, the term "standalone" refers to a device that is physically separated in a distinct housing from other components (i.e., the power controller and the plasma creation device).

Electrical pathway 106, which can be a wire, a cable (e.g., an RF or coaxial cable), or other suitable means of electrically connecting power source 101 to the other components in the system, is electrically coupled to detector 102 to provide power input to detector 102 to allow detector 102 to receive current and voltage signals representative of the total impedance in electrical pathway 106, which includes a combination of forward and reflected power. Electrical pathway 106 is further electrically coupled to matching network 103 in a way that allows matching network 103 to tune the impedance of the system. Matching network 103 is in electrical communication with detector 102 via detector output signal pathway 110 into Processing Circuitry 105 and then sent through signal pathway 107 to provide electrical signals to matching network 103 to tune the system to minimize the impedance difference between power source 101 and atmospheric pressure plasma creation device 104. In an embodiment, electrical pathway 106 can be a single cable running from power source 101 to plasma creation device 104 with junctions placed such that power can be bled off of electrical pathway 106 and fed into detector 102 and matching network 103. Alternatively, electrical pathway 106 (e.g., a transmission cable) can connect directly into the components in detector 102 such that the electrical pathway between power source 101 and plasma creation device 104 runs through detector 102 and matching network 103.

In an embodiment, detector 102 includes circuitry to receive power extant in electrical pathway 106, which includes both forward power provided by power source 101 and reflected power from plasma creation device 104. The power can be RF power or any appropriate power. Detector 102 includes circuitry to create an electrical signal representative of the current in electrical pathway 106, and further includes circuitry to create an electrical signal representative of the voltage within electrical pathway 106. Detector 102 further includes circuitry to determine both the magnitude and phase angle of the electrical power in electrical pathway 106. In an embodiment, processing circuitry 105 is configured to run a tuning algorithm to receive the magnitude and phase signals, and to generate a control signal to control matching network 103 to minimize the magnitude and phase voltages. In an embodiment, the processing circuitry can be a processor on one or more chips.

As discussed below, in an embodiment, matching network 103 can include circuitry to alter the magnitude and phase of the power along the electrical pathway such that the load impedance of the plasma creation device 104 matches the impedance of the power provided by power source 101, thus stabilizing the power provided to plasma creation device 104 and providing an efficient transfer of power to create plasma. In some embodiments, power source 101, detector 102, and matching network 103 are implemented in a unified power controller housing. In other embodiments, detector 102 and/or matching network 103 are separate from power source 101 in one or more separate housings. In an embodiment where matching network 103 is separated from power source 101 and detector 102, power source 101 and detector 102 can be placed at an arbitrarily chosen distance from matching network 103, and from plasma source 104.

Figure 2:
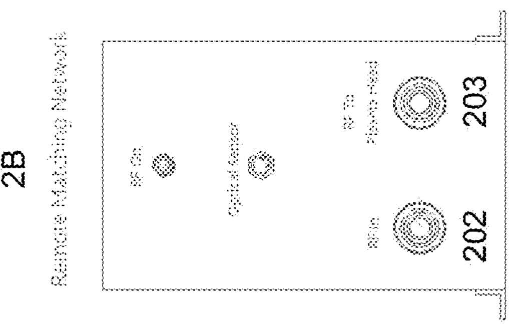
FIG. 2 is a diagram portraying a face for a power controller and matching network, according to an embodiment.
Figure 2:
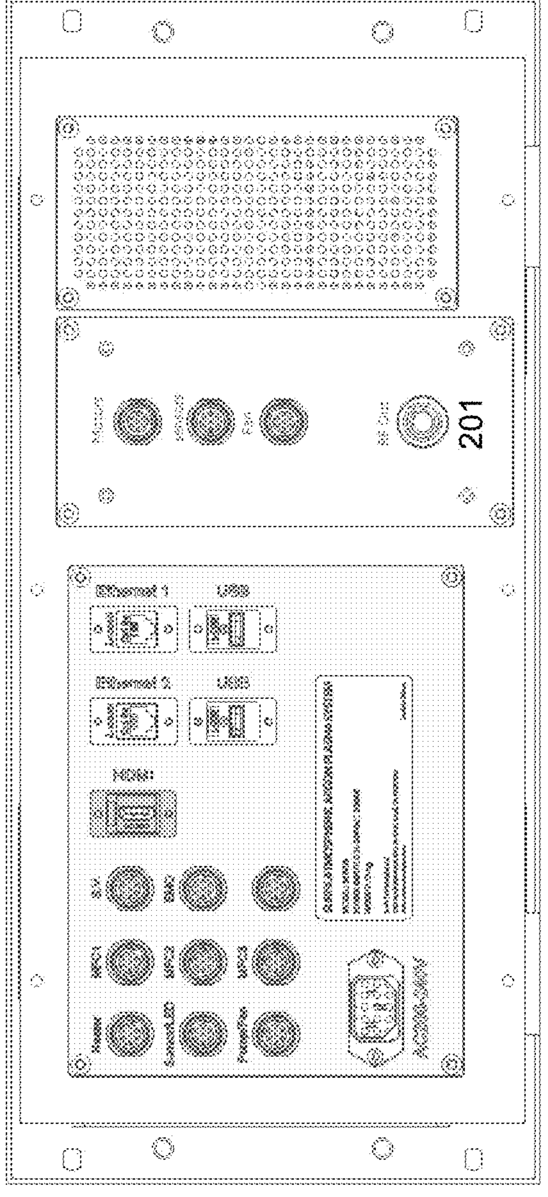

FIG. 2 is a diagram portraying a face for power controller 2A (which is shown in FIG. 1 as power controller 101 and matching network 2B (which is shown in FIG. 1 as matching network 103), according to an embodiment. Power controller 2B includes an RF Out port 201 for outputting RF power to remote matching network 2B, which, unlike prior embodiments as discussed above, can be placed a distance from power controller 2A that does not need to be predetermined for tuning impedance in the system. Matching network 2B receives RF power via RF In port 202, and outputs power to a plasma head via RF port 203. In an embodiment, power controller 2A includes a detector (shown as detector 102 in FIG. 1) to determine an impedance mismatch in the system, and output a control signal to matching network 2B to adjust the components within matching network 2B to tune, and preferably minimize, the impedance mismatch in the system.

Figure 3:
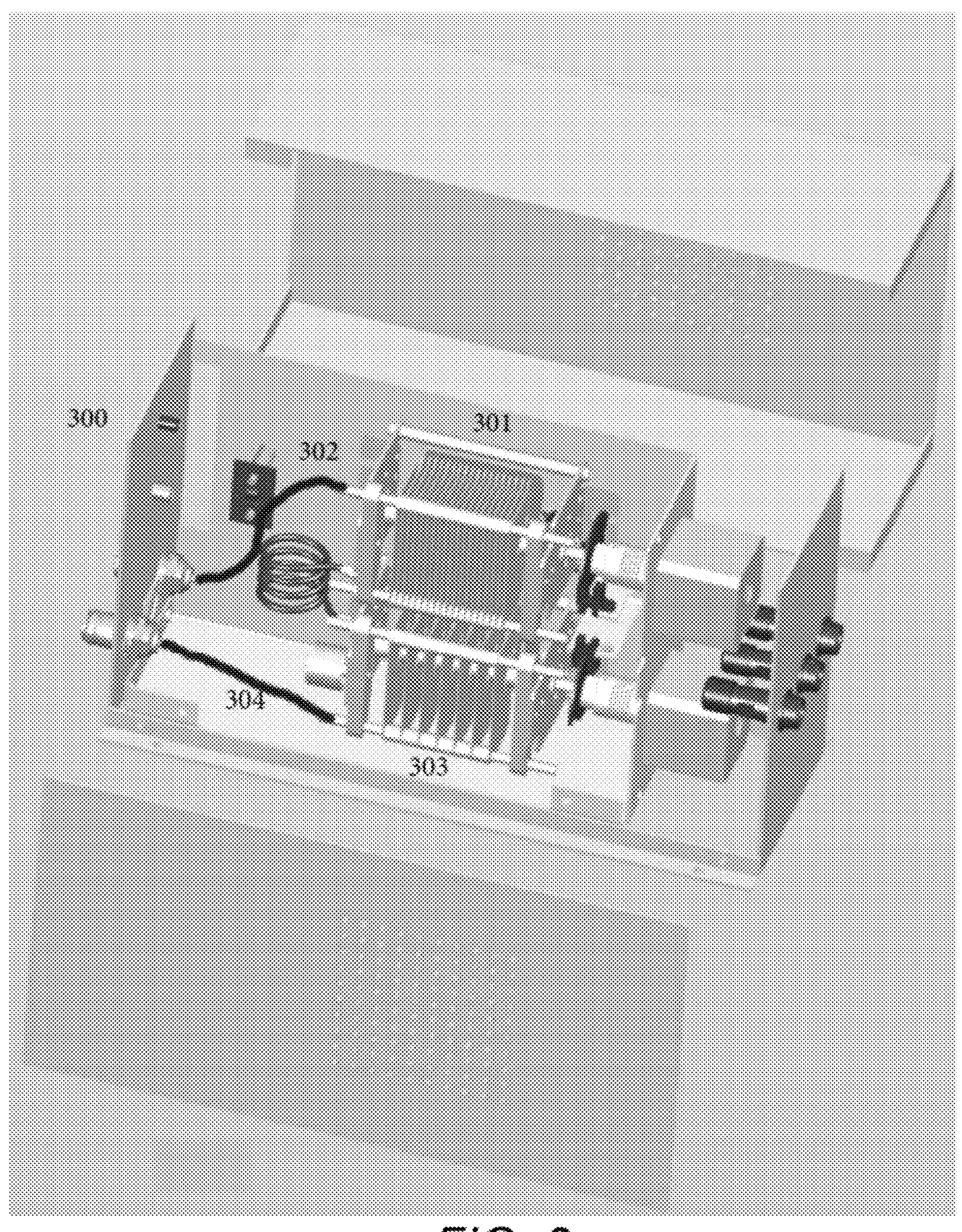
FIG. 3 is an exploded view of a matching network, according to an embodiment.

FIG. 3 is an exploded view of matching network 300 (shown as matching network 103 in FIG. 1, and matching network 2B in FIG. 2), according to an embodiment. Matching network 300 includes internal RF cable connectors 302 and 304 for inputting and outputting power to matching network 300. Matching network 300 further includes variable phase capacitor 301 for adjusting phase of the RF power in the system, and variable load capacitor 303 for adjusting the RF load in the system.

Figure 4:
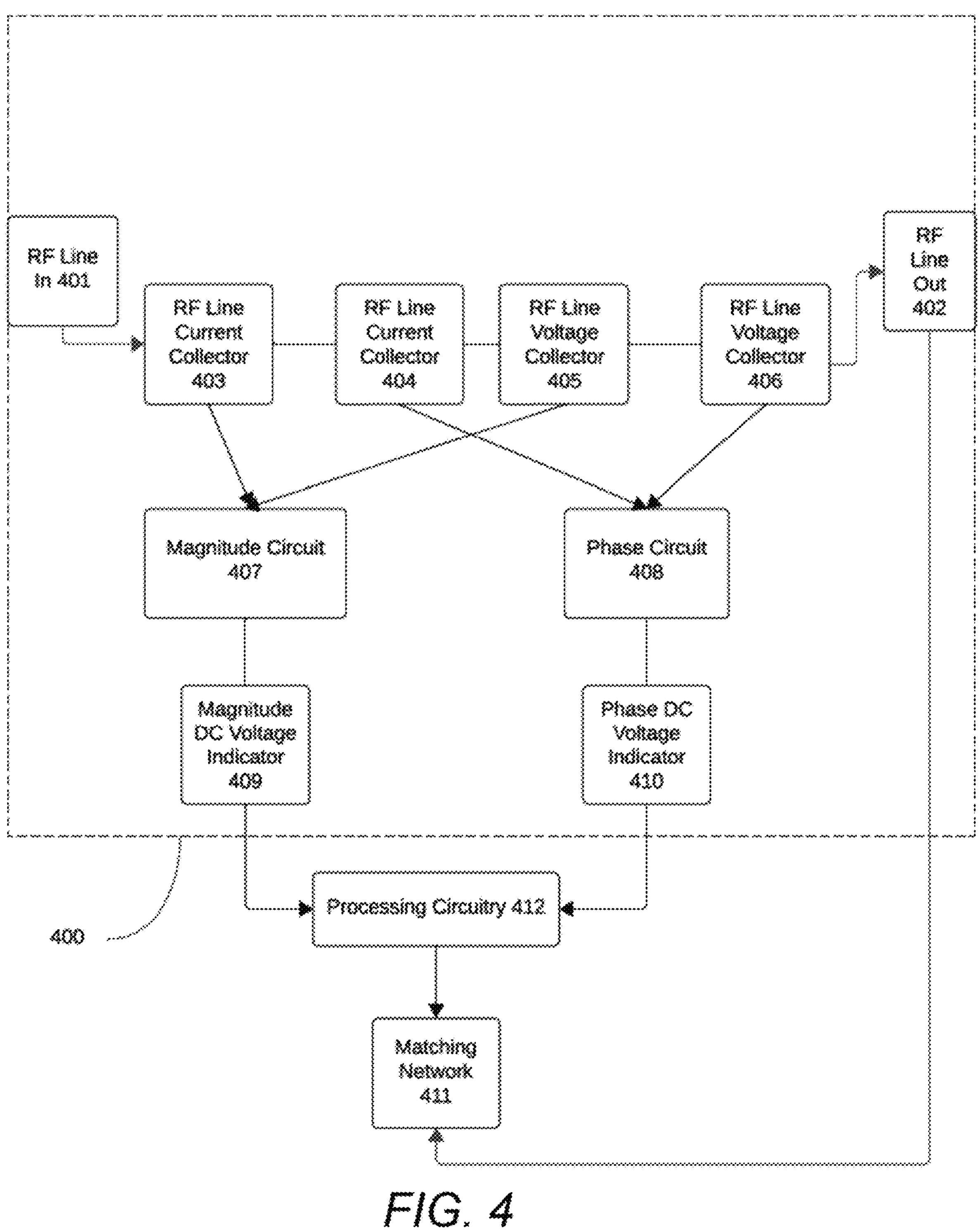
FIG. 4 is a block diagram of a detector used to measure the RF power phase and magnitude, according to an embodiment.

FIG. 4 is a schematic representing the functional elements of circuitry within a standalone phase and magnitude detector 400 for generating signals to be sent to the impedance matching network to minimize impedance differences in the system, according to an embodiment where the power is RF power. As shown in the figure, RF line in 401, which can be an RF coaxial cable, is fed through the phase and magnitude detector, exiting the detector via RF line out (coaxial cable) 402 to continue on to matching network 411. Following the signal from left to right in the diagram, the RF line first goes through current collector 403, which in an embodiment uses an inductor coil (not shown) to induce a corresponding sinusoidal AC current that is then fed into magnitude circuit 407. The RF line then goes through current collector 404, which uses an inductor coil to induce a corresponding sinusoidal AC current that is then fed into phase circuit 208.

The RF line then goes through voltage collector 405, which in an embodiment uses a soldered capacitor connection to RF line in 401 to feed into magnitude circuit 407. Additionally, the RF line goes through voltage collector 406, which uses a soldered capacitor connection to the RF line to feed into phase circuit 408.

In an embodiment, in magnitude circuit 407, the line voltage related signal collected at 405 is scaled down by 50× to provide a signal of similar magnitude to the line current signal collected at RF line current collector 403. The line voltage related signal collected at 405 is then rectified to produce a positive DC signal, while the line current related signal collected at 403 is rectified to produce a negative DC signal. The rectified line current DC signal and the rectified line voltage DC signal are then summed together at magnitude DC voltage indicator 409 to produce a magnitude DC voltage indicator signal. In an embodiment, the magnitude DC voltage indicator signal can be fed into Processing Circuitry 412 to generate a digital signal that is used to manipulate the elements of an impedance matching network.

When the load impedance is close to the natural impedance of RF line in 401 (e.g., 50 ohms for a standard RF coaxial cable), the signals will sum to produce a zero volt magnitude DC voltage indicator signal. When the load impedance differs from, in this example, 50 ohms, the magnitude DC voltage indicator will produce a positive indicator signal when the line voltage amplitude is greater than the line current, or a negative voltage indicator when the line voltage amplitude is smaller than the line current amplitude. In an embodiment, the line voltage related signal collected at 405 is rectified to produce a negative DC signal, and the line current related signal collected at 403 is rectified to produce a positive DC signal. In this example, a 50 ohm impedance will still produce a zero volt signal, but when the line voltage amplitude is greater than the line current the magnitude signal will be negative and when the line voltage amplitude is smaller than the line current amplitude it will generate a positive voltage indicator.

Phase circuit 408 receives a sinusoidal signal from line current collector 404, and from line voltage collector 406, where the sinusoidal signal for the line voltage from line voltage collector 406 is shifted, in an embodiment, to be 90 degrees leading the line current from RF line current collector 404. In an embodiment, the detector includes circuitry such that the voltage lags the current instead of leading it. Additionally, the unshifted line current signal received in phase circuit 408 is used to generate two signals, with one being in phase with the line current (the unshifted line current signal), and one being 180 degrees out of phase with the line current (the shifted line current signal). The unshifted line current signal can then be added to the 90-degrees-shifted line voltage signal and is rectified to produce a DC voltage. Similarly, the 180-degrees-shifted line current signal is added to the 90 degrees shifted line voltage signal and is rectified to produce another DC voltage.

The two DC voltage signals are then summed together in the phase DC voltage indicator to produce a phase DC voltage indicator signal with the following properties: when the line voltage from RF line voltage collector 406 and the line current from RF line current collector 404 are in phase, the two DC voltage signals will have equal voltage but with opposite sign and will sum to produce a zero-volt phase DC voltage indicator signal. When the line current from RF line current collector 404 leads the line voltage from RF line voltage collector 406, the phase DC voltage indicator 410 will become negative. Similarly, when the line current from RF line current collector 404 lags the line voltage from RF line voltage collector 406, the phase DC voltage indicator 410 will become positive.

Figure 5:
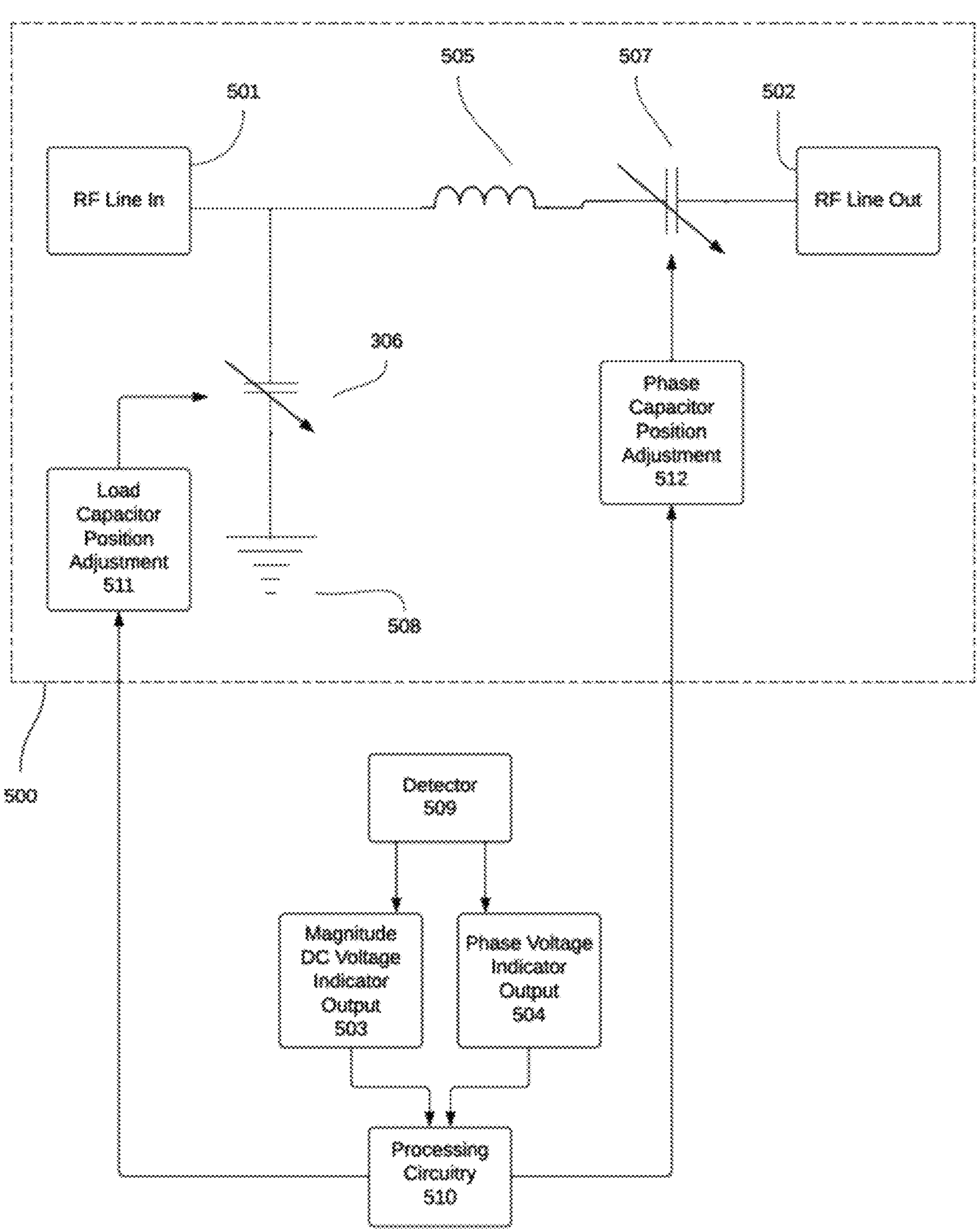
FIG. 5 is a block diagram of an impedance matching network, according to an embodiment.

The magnitude DC voltage indictor signal and the phase DC voltage indicator signal can then be passed through processing circuitry 412 (shown in FIG. 1 as processing circuitry 105) to generate and send a control signal to impedance matching network 500 (FIG. 5) (shown in FIG. 1 as matching network 103, in FIG. 2 as matching network 2B, in FIG. 3 as matching network 300, and in FIG. 4 as matching network 411) which can placed a distance from the power source, to tune the network, where the distance does not need to be chosen to tune the network. In an embodiment, the magnitude DC voltage indictor signal and the phase DC voltage indicator signal are turned into output signals from a processor to generate a signal used to manipulate variable load and phase capacitors in the matching network. Referring to FIG. 5, in an embodiment, detector 509 produces the magnitude DC voltage indicator output 503 and phase DC voltage indicator output 504. These signals are digitized and sent into Processing Circuitry 510 where they are input into a magnitude tuning control algorithm and a phase tuning control algorithm, where the digitized magnitude DC voltage indicator signal 503 is used to adjust the position of variable load capacitor 506, and the digitized phase DC voltage indicator signal 504 is used to adjust the position of variable phase capacitor 507.

Figure 6:
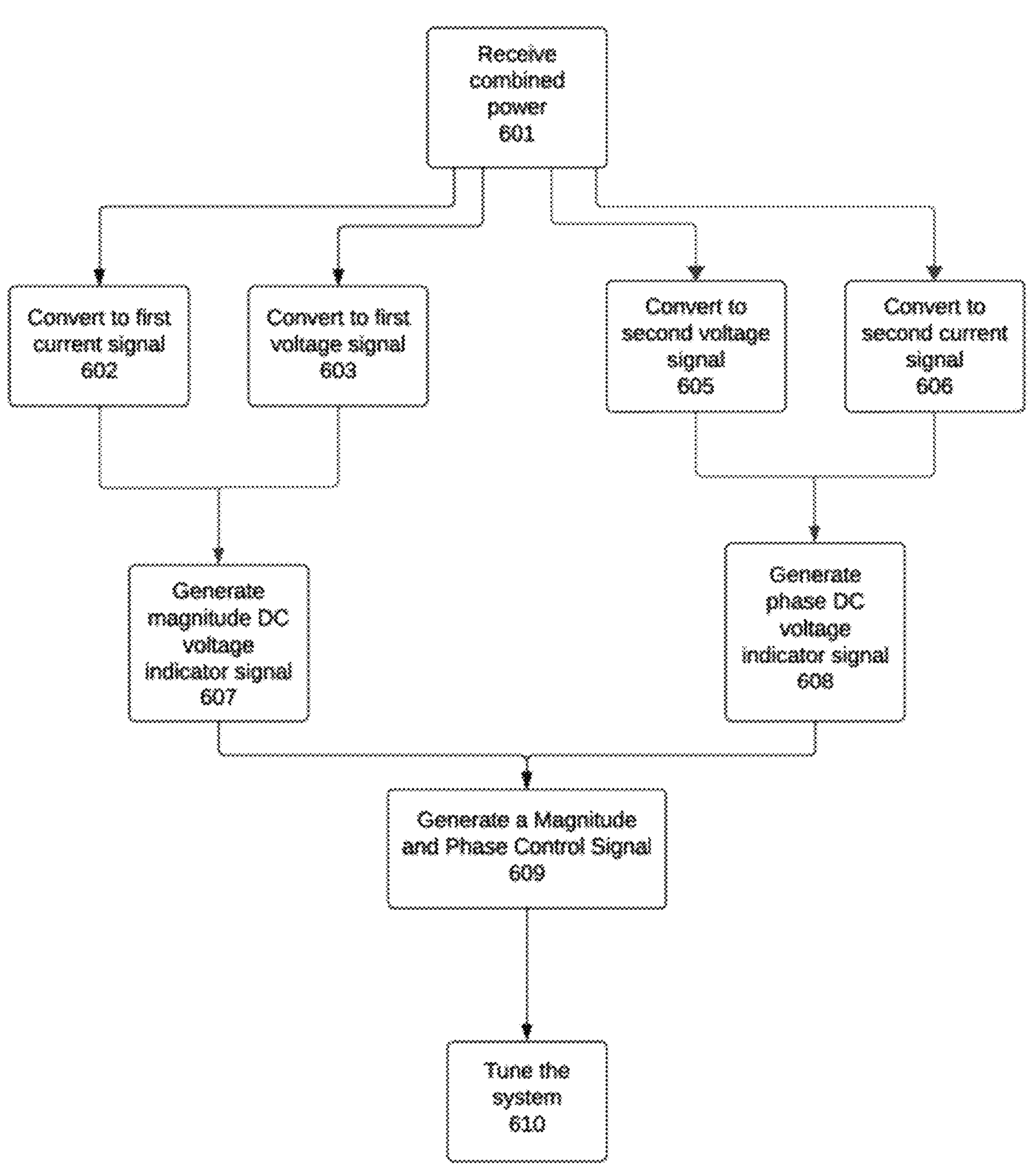
FIG. 6 is a flow chart of a method for tuning the impedance of a system using both a magnitude and phase detector to provide inputs to an impedance matching network, according to an embodiment.

FIG. 6 is a flow chart for tuning the impedance of a system using both a magnitude and phase detector to provide inputs to an impedance matching network, according to an embodiment. Focusing on the magnitude and phase detector, combined power is received at 601. The magnitude and phase detectors serve to compare the RF line voltage and RF line current to each other. The combined power is a combination of the power that flows from the power source to, for example, a plasma creation device, and includes any reflections or other impedance mismatching that occur along the electrical pathway. For example, the electrical pathway can flow through to the plasma creation device, but have connections at the magnitude and phase detector and the impedance matching network that reflect power back into the electrical pathway. Alternatively, the electrical pathway from the power source to the plasma creation device can flow through, and thus include the phase and magnitude detector and/or the matching network. Thus, the power flowing through the electrical pathway can include impedance from the detector and/or the matching network.

The detector can be thought of as comprising a magnitude circuit that detects and controls a magnitude signal, and a phase circuit that detects and controls a phase signal. With regard to the magnitude circuit, once the combined power is received at 601, it is converted to a first current signal at 602 and a first voltage signal at 603. As will be discussed in greater detail in FIG. 7, the first current signal and first voltage signal are then used to generate magnitude DC voltage indicator signal 607. Once the magnitude DC voltage indicator signal is generated, it is used to generate a magnitude control signal at 609. Likewise, once the combined power is received at 601, it can be fed into the phase circuit of the detector, where it is converted into a second voltage signal at 605 and a second current signal at 606. These two signals, the second voltage signal and second current signal, are used at 608 to generate a phase DC voltage indicator signal, which is then used to generate a phase control signal, also at 609. The magnitude and phase control signals are then sent, to the matching network to tune the system at 610.

Figure 7:
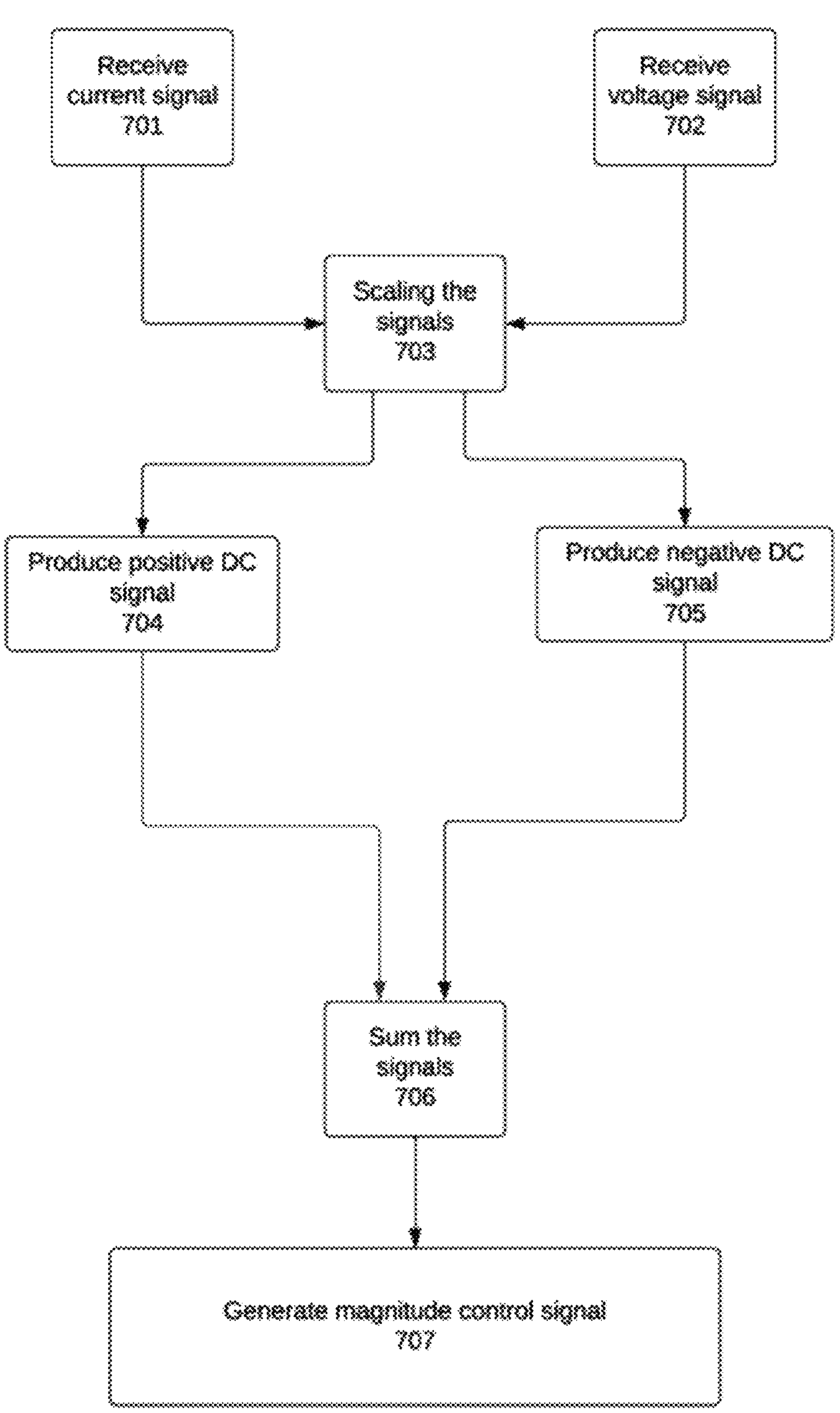
FIG. 7 is a flow chart of a method for creating a magnitude DC voltage indicator signal for tuning a load capacitor of an impedance matching network.

FIG. 7 is a flow chart of a method for creating a magnitude DC voltage indicator signal for tuning a load capacitor of an impedance matching network. To create a usable magnitude DC voltage indicator signal, a current signal is received at 701 and a voltage signal is received at 702, into the magnitude circuit. These signals are not used in their raw form, but rather are manipulated to a form that can be used to tune a variable load capacitor in the impedance matching network.

Thus, at 703, this signals are first scaled relative to each other. For example, in a 50 ohm system, in the magnitude circuit, the line voltage related signal is scaled down by a factor of 50 to create a signal wave with an amplitude similar in magnitude to the line current signal. The line voltage signal is then rectified at 704 to produce a positive DC signal, and the line current related signal is rectified at 705 to produce a negative DC signal.

At 706, the rectified line current DC signal and the rectified line voltage signal are summed together to produce the magnitude DC voltage indicator signal. Thus, when the load impedance in the system is close to 50 ohms, the signals will sum to produce a zero-volt magnitude DC voltage indicator signal. When, however, the load impedance differs from 50 ohms, the magnitude DC voltage indicator signal will be positive when the line voltage amplitude is greater than the line current, or negative when the line voltage amplitude is smaller than the line current amplitude. Once generated, this signal can then be used to generate a magnitude control signal at 707 to be sent to the impedance matching network for use in tuning a variable load capacitor.

Figure 8:
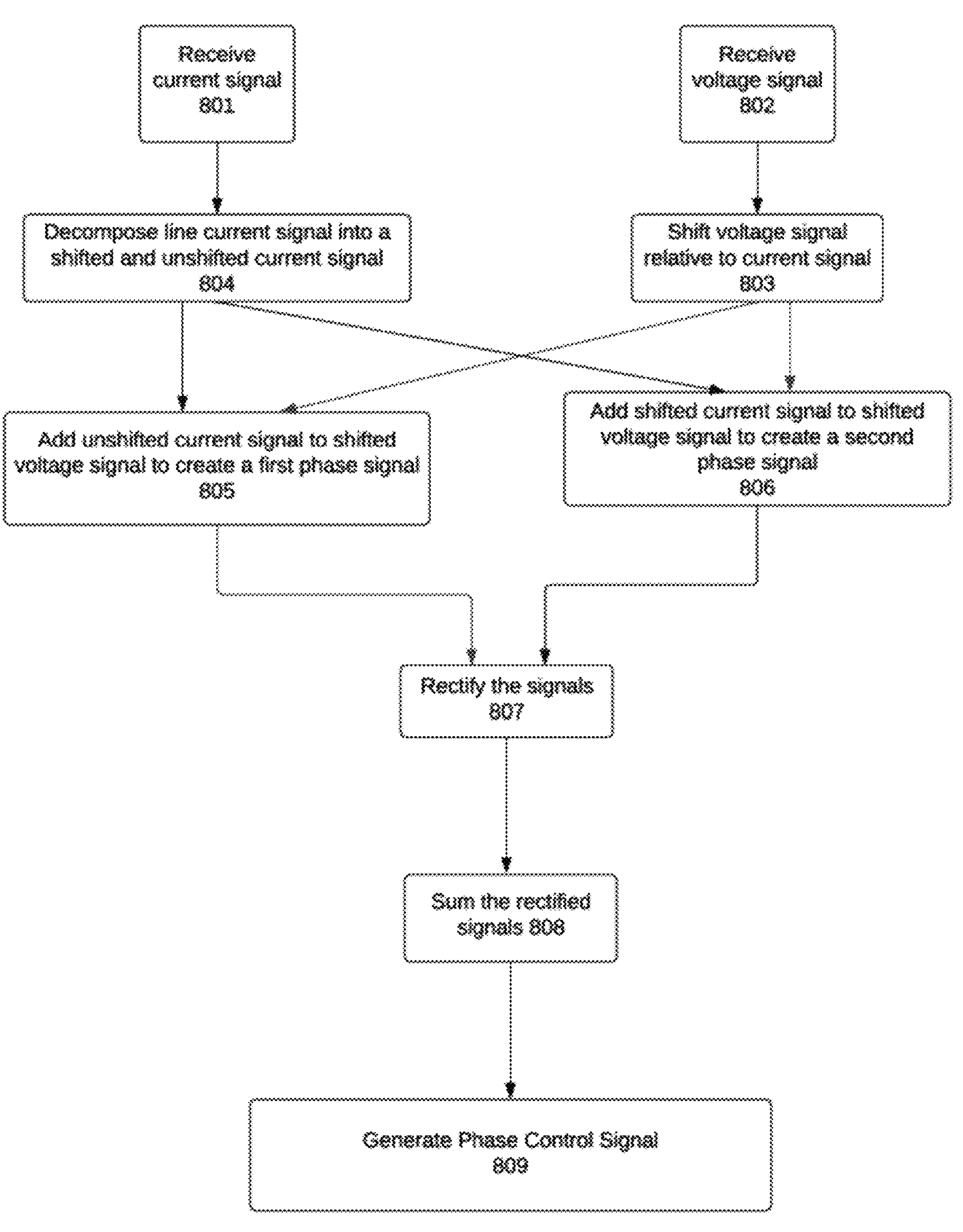
FIG. 8 is a flow chart of a method for creating a phase DC voltage indicator signal for tuning a phase capacitor of an impedance matching network.

FIG. 8 is a flow chart of a method for creating a phase DC voltage indicator signal for tuning a phase capacitor of an impedance matching network. Similar to the magnitude DC voltage indicator, to create a usable phase DC voltage indicator signal, the current signal received at 801 and the voltage signal received at 802 must be manipulated by the phase circuit.

In an embodiment, at 803, the voltage signal is shifted to lead the line current by 90 degrees. In an embodiment, the voltage signal could be shifted to lag the line current by 90 degrees. The line current signal is then decomposed, at 804, into an unshifted current signal that is in phase with the line current signal, and a shifted current signal that is out of phase with the line current signal by 180 degrees.

At 805, the unshifted current signal is added to the shifted voltage signal to create a first phase signal. At 806, the shifted current signal is added to the shifted voltage signal to create a second phase signal. Both signals are then rectified at 807 to produce DC voltage signals.

The two rectified DC voltage signals are then summed together at 808 to create the phase DC voltage indicator signal. When the line voltage and the line current are in phase, the two DC voltage signals will have equal voltage but with opposite sign and will sum to produce a zero-volt phase DC voltage indicator signal. When the line current leads the line voltage, the phase DC voltage indicator signal will become negative, and when the line current lags the line voltage, the phase DC voltage indicator signal will become positive. Once generated, the phase DC voltage indicator signal is used to generate a phase control signal at 809 to be used in tuning a variable phase capacitor.

Figure 9:
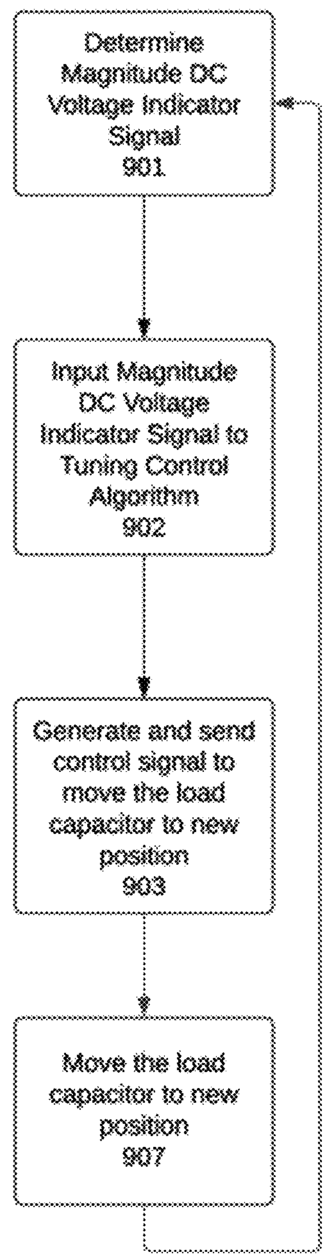
FIG. 9 is a flow chart of a method for using an impedance matching network for tuning the impedance of a system, according to an embodiment.
Figure 9:
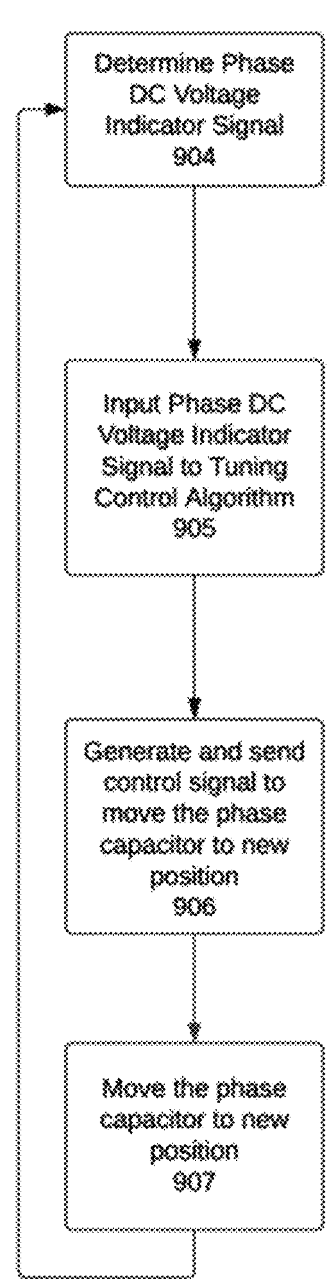

FIG. 9 is a flow chart of a method for using an impedance matching network for tuning the impedance of a system, according to an embodiment.

In an embodiment, once the magnitude DC voltage indicator and phase DC voltage indicator signals are determined 901 and 904, respectively, they are used to manipulate the internal components of the matching network to tune the system's impedance.

At 902, the magnitude DC voltage indicator signal is used as input to a magnitude tuning control algorithm to manipulate a load capacitor in the matching network by moving it to a new position, thereby changing its capacitance. The magnitude tuning control algorithm performs a single tuning iteration through the use of the following formula, where the new variable load capacitor position within the impedance matching network is given by the following formula:

$$[\text{New Load Capacitor Positon}] = [\text{Previous Load Capacitor Position}] + [\text{Magnitude } DC \text{ Voltage Indicator}] \times [\text{Magnitude Gain}].$$

Once the new position is calculated, at 903 it is used to generate and send a control signal to the matching network where, at 907, the load capacitor is moved to its new position, thereby changing its capacitance.

Similarly, at 904, the phase DC voltage indicator signal is determined and, at 905, is used as input to a phase tuning control algorithm to manipulate a variable phase capacitor in the matching network by moving it to a new position, thereby changing its capacitance. At 906, the phase DC voltage indicator signal is used to generate and send a phase control signal to the matching network to move the phase capacitor to a new position.

The phase tuning control algorithm performs a single tuning iteration through the use of the following formula, where new variable phase capacitor position within the impedance matching network is given by the following formula:

$$[\text{New Phase Capacitor Positon}] = [\text{Previous Phase Capacitor Position}] + [\text{Phase } DC \text{ Voltage Indicator}] \times [\text{Phase Gain}].$$

Once the new phase and load capacitor positions are calculated, the applicable capacitor receives a signal to move to that new position. Once the new position is calculated, the control signal is sent at 906 to the matching network where, at 907, the phase capacitor is moved to its new position, thereby changing its capacitance.

The updated magnitude DC voltage indicator signals and phase DC voltage indicator signals are continually recalculated, and the tuning algorithm proceeds through this iterative process.

In an embodiment, the phase gain and magnitude gain values are determined through experimentation. In an embodiment, a plurality of data points of gain is taken and plotted. If the gain value is too large, the applicable variable capacitor will be moved too aggressively such that the capacitor moves past the position that would have resulted in a zero-volt DC voltage indicator value. If the gain value is too large, the system will overshoot and then undershoot the target causing the matching network to continuously oscillate around the desired position and fail to match the impedance. If the gain value is too small, the applicable variable capacitor will eventually reach its desired position and match the system impedance, although this could take an arbitrarily long time to achieve. The gain value can also be either positive or negative. Choosing the wrong sign for the gain value will cause the variable capacitor to move in a direction that increases the value of the DC voltage indicator signal while choosing the correct sign will cause the variable capacitor to move in the direction which reduces the DC voltage indicator signal towards a zero-volt value. Thus, to determine gain value for a given variable capacitor, the goal is to start with small increments, and then increase the gain incrementally to find a gain value for a given variable capacitor that is as large as possible without introducing instability.

In the example of a 50 ohm circuit, when the Impedance Matching Network has tuned the system to a purely resistive 50 ohm circuit, the magnitude DC voltage indicator signal and the phase DC voltage indicator signal will both be zero. Thus, the iterative tuning process proceeds until both the phase DC voltage indicator and the magnitude DC voltage indicator are zero. When the indicator voltage is zero, then the above equations will produce an output where the New Phase Capacitor Position is the same as the Previous Phase Capacitor Position and correspondingly the New Load Capacitor Position is the same as the Previous Load Capacitor Position. In this case tuning of the matching network will cease until a non-zero indicator signal is received. In practice, a deadband can be implemented wherein the phase and magnitude DC voltage indicator signals are not required to be precisely zero-volts in order to suspend the tuning algorithm. The deadband consists of a range of phase and magnitude DC voltage indicator values around zero-volts for which the tuning algorithm will be defined to have no response. This deadband value can be determined experimentally by establishing the range of DC indicator voltage values for which the system is tuned sufficiently close to a pure 50-ohm impedance that further tuning provides a negligible improvement.

Figure 10:
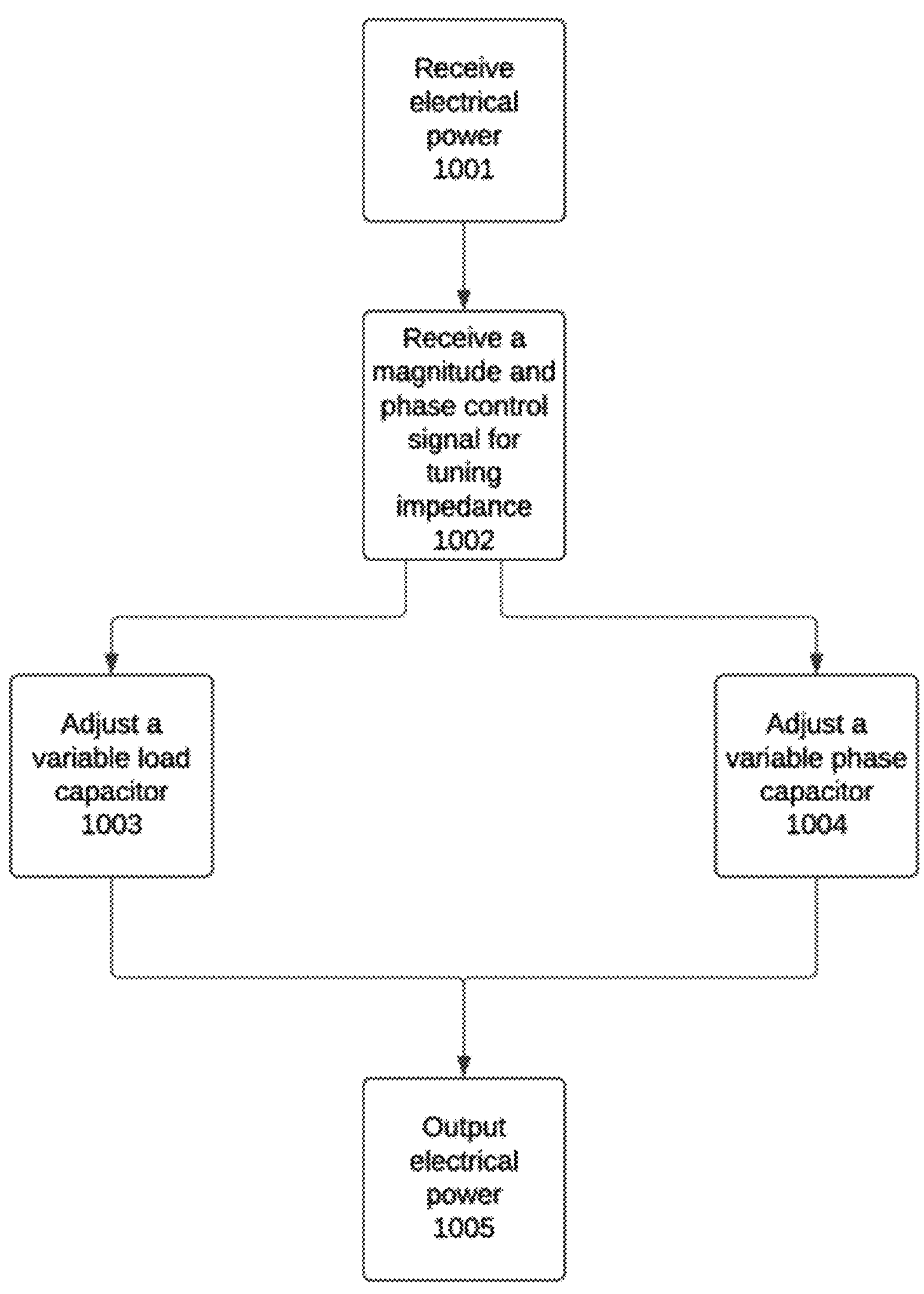
FIG. 10 is a flow chart of a method of using a matching network, according to an embodiment.

FIG. 10 is a flow chart showing a method of using a matching network, according to an embodiment. At 1001, electrical power is received at the matching network. The electrical power includes a combined power including forward electrical power from a power controller, and reflected electrical power from a load including an atmospheric plasma device, creating an impedance.

At 1002, a magnitude and phase control signal is received for tuning the impedance. In an embodiment, the control signals can be received from the power controller. In an embodiment, the control signal is received from an impedance-matching detector. In yet another embodiment, the control signal can be received from a processor. In yet another embodiment, the control signal can be generated from within the standalone matching network.

Using the control signal, at 1003, a variable load capacitor housed in the matching network is adjusted. Independently, the variable phase capacitor housed in the matching network is adjusted at 1004. Once the adjustment is made, then at 1005, electrical power is output to the atmospheric plasma device. This process can be continually repeated to provide for a consistent impedance that is tuned in real time for a particular atmospheric plasma creation device.

Modifications, additions, or omissions may be made to the systems, apparatuses, and methods described herein without departing from the scope of the disclosure. For example, in the appropriate context, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, “each” refers to each member of a set or each member of a subset of a set.

What is claimed is:

1. A system comprising:

a matching network, where the matching network comprises:

receiving circuitry to receive magnitude and phase control signals from an RF power source for combined electrical power;

a variable load capacitor;

a variable phase capacitor; and tuning circuitry coupled to the receiving circuitry, the tuning circuitry responsive to the magnitude and the phase control signals to tune an impedance presented to the RF power source:

wherein the impedance is tuned by independently adjusting each of the variable load capacitor and the variable phase capacitor;

wherein components of a line voltage related signal collected from the RF power source are rectified to produce the magnitude control signal used to tune the impedance presented to the RF power source.

2. The system of claim 1, further including a detector receiving combined electrical power comprising both forward power and reflected power and electrically coupled to the receiving circuitry to receive the magnitude and phase control signals, the detector including calculating circuitry to calculate a magnitude DC voltage indicator signal and a phase DC voltage indicator signal in real time.

3. The system of claim 2, where the calculating circuitry calculates the magnitude and phase control signals in real time by performing the operations including:

converting at least a first portion of the combined electrical power into a first current signal;

converting at least a second portion of the combined electrical power into a first voltage signal;

creating the magnitude DC voltage indicator signal using the first current signal and the first voltage signal;

converting at least a third portion of the combined electrical power into a second current signal;

converting at least a fourth portion of the combined electrical power into a second voltage signal; and creating the phase DC voltage indicator signal using the second current signal and the second voltage signal.

4. The system of claim 1, further comprising a first cable connector for receiving RF electrical power from the RF power source; and a second cable connector to output the RF electrical power.

5. The system of claim 2, further comprising:

a power controller located within a power controller housing different from a matching network housing that includes the matching network; and an atmospheric pressure plasma creation device located within a plasma creation device housing different from the matching network housing;

wherein the power controller is electrically coupled to the matching network via a first RF cable, and wherein the atmospheric pressure plasma creation device is electrically coupled to the matching network via a second RF cable.

6. The system of claim 5, wherein the detector is contained within the power controller housing.

7. The system of claim 5, wherein the detector is a standalone device.

8. The system of claim 2, wherein:

the tuning circuitry to adjust the variable phase capacitor is capable of moving the variable phase capacitor to a new phase position, the new phase position of the variable phase capacitor being calculated as a current phase capacitor position added to the phase DC voltage indicator signal multiplied by a phase gain; and wherein the tuning circuitry to adjust the variable load capacitor is capable of moving the variable load capacitor to a new load position, the new load position of the variable load capacitor being calculated as a current load capacitor position added to the magnitude DC voltage indicator signal multiplied by a magnitude gain.

9. A method comprising:

receiving, at a matching network, electrical power by way of a first RF cable;

receiving a magnitude control signal, and a phase control signal;

tuning, based on the received magnitude control signal and the received phase control signal, an impedance of the electrical power by independently adjusting a variable load capacitor and a variable phase capacitor; and outputting the electrical power comprising the tuned impedance by way of a second coaxial cable;

wherein components of a line voltage related signal collected from a RF power source are rectified to produce the magnitude control signal used to tune the impedance of the electrical power.

10. The method of claim 9, wherein the tuning of the impedance includes tuning instructions for:

adjusting based on a magnitude DC voltage indicator signal, the variable load capacitor until the magnitude DC voltage indicator signal is substantially zero; and adjusting, based on a phase DC voltage indicator signal, the variable phase capacitor until the phase DC voltage indicator signal is substantially zero, wherein the adjusting of the variable phase capacitor is performed independently of the adjusting the variable load capacitor.

11. The method of claim 10, further comprising calculating the magnitude DC voltage indicator signal and the phase DC voltage indicator signal in real time.

12. A method comprising:

receiving, at a detector, combined electrical power comprising both forward power and reflected power in a system that includes an atmospheric pressure plasma creation device configured to operate at atmospheric pressure, the combined electrical power having an impedance;

converting the combined electrical power into a magnitude DC voltage indicator signal and a phase DC voltage indicator signal;

calculating, at a processor, instructions to tune the impedance to independently adjust a magnitude and a phase of the combined power;

sending the instructions via a signaling cable to a matching network; and tuning the impedance according to the instructions.

13. The method of claim 12, wherein the matching network comprises a standalone matching network.

14. The method of claim 12, wherein the converting of the combined electrical power includes:

converting at least a first portion of the combined electrical power into a first current signal;

converting at least a second portion of the combined electrical power into a first voltage signal;

creating, using the first current signal and the first voltage signal, a magnitude DC voltage indicator signal;

converting at least a third portion of the combined electrical power into a second current signal;

converting at least a fourth portion of the combined electrical power into a second voltage signal; and creating, using the second current signal and the second voltage signal, a phase DC voltage indicator signal;

wherein the tuning of the impedance includes:

adjusting, based on the magnitude DC voltage indicator signal, a load capacitor until the magnitude DC voltage indicator signal is substantially zero; and adjusting, based on the phase DC voltage indicator signal, a phase capacitor until the phase DC voltage indicator signal is substantially zero;

wherein the adjusting of the phase capacitor is performed independently of the adjusting of the load capacitor.

15. The method of claim 14, wherein the creating of the magnitude DC voltage indicator signal comprises:

scaling at least one of the first voltage signal and the first current signal to make the first voltage signal similar to the first current signal;

rectifying the first voltage signal to produce a first positive DC signal;

rectifying the first current signal to produce a first negative DC signal; and summing the first positive DC signal and the first negative DC signal to produce the magnitude DC voltage indicator signal.

16. The method of claim 14, wherein the creating of the phase DC voltage indicator signal comprises:

shifting the second voltage signal relative to the second current signal to create a shifted voltage signal;

decomposing the second current signal into a shifted current signal and an unshifted current signal, the shifted current signal being shifted by 90 degrees;

adding the unshifted current signal to the shifted voltage signal to produce a first phase signal;

adding the shifted current signal to the shifted voltage signal to produce a second phase signal;

rectifying the first and second phase signal; and summing the first and second phase signal to produce the phase DC Voltage indicator signal.

17. The method of claim 14, further comprising:

digitizing both the magnitude DC voltage indicator signal and the phase DC voltage indicator signal; and applying a phase algorithm to the phase DC voltage indicator signal, and a magnitude algorithm to the magnitude DC voltage indicator signal, the phase algorithm and magnitude algorithm being linearly independent of each other.

18. The method of claim 14, where:

the adjusting of the phase capacitor comprises changing a phase position of the phase capacitor to a new phase position, thereby changing a phase capacitance of the phase capacitor; and the adjusting of the load capacitor comprises changing a load position of the load capacitor to a new load position, thereby changing a load capacitance of the load capacitor.

19. The method of claim 18, where:

the new phase position is calculated by the following equation:

a current phase capacitor position added to a phase DC voltage indicator signal multiplied by a phase gain; and the new load position is calculated as a current load capacitor position added to a magnitude DC voltage indicator signal multiplied by a magnitude gain.

20. The system of claim 1, wherein the impedance is tuned in real time such that the matching network can be placed an arbitrarily selected distance from a power source and near enough to an atmospheric pressure plasma creation device powered by the power source to allow for efficient dynamic minimization of the impedance.

* * * * *